United States Patent
Seol et al.

(10) Patent No.: US 7,795,159 B2
(45) Date of Patent: Sep. 14, 2010

(54) CHARGE TRAP LAYER FOR A CHARGE TRAP SEMICONDUCTOR MEMORY DEVICE AND METHOD OF MANUFACTURING THE SAME

(75) Inventors: Kwang-soo Seol, Suwon-si (KR); Yo-sep Min, Yongin-si (KR); Sang-min Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 11/987,425

(22) Filed: Nov. 30, 2007

(65) Prior Publication Data
US 2008/0131710 A1  Jun. 5, 2008

(30) Foreign Application Priority Data
Nov. 30, 2006 (KR) ...................... 10-2006-0120142

(51) Int. Cl.
H01L 21/31 (2006.01)
(52) U.S. Cl. .................. 438/773; 438/431; 438/261; 438/216; 257/324
(58) Field of Classification Search .................. 438/431, 438/773, 453, 678, 679, 216, 261, 591, 593; 257/324
See application file for complete search history.

(56) References Cited

U.S. PATENT DOCUMENTS

| | | | |
|---|---|---|---|
| 6,548,825 | B1 | 4/2003 | Yoshii et al. |
| 6,998,317 | B2 | 2/2006 | Ono |
| 2004/0004245 | A1 | 1/2004 | Forbes et al. |
| 2004/0264236 | A1 | 12/2004 | Chae et al. |
| 2005/0072989 | A1 | 4/2005 | Bawendi et al. |
| 2005/0212065 | A1 | 9/2005 | Forbes |
| 2006/0228868 | A1* | 10/2006 | Ahn et al. ................... 438/453 |

OTHER PUBLICATIONS

WEb document of Atomic Layer Deposition by Wikipedia 9$^{th}$ Oct. 16, 2009.*
European Search Report dated Apr. 9, 2009.
C.T. Swift et al., "An Embedded 90nm SONOS Nonvolatile Memory Utilizing Hot Electron Programming and Uniform Tunnel Erase", pp. 927-930 in Technical Digest of International Electron Device Meeting (IEDM), published in Dec. 2002.
Shi-Jin Ding et al "High Density and Program-Erasable Metal-Insulator-Silicon Capacitor with a Dielectric Structure of $SiO_2/HfO_2$-$Al_2O_3$ nanolaminate/$Al_2O_3$", pp. 042905(1)-042905(3) in Applied Physics Letter vol. 88, published in 2006.
Seong Keun Kim et al.,"Comparison Between ZnO Films Grown by Atomic Layer Deposition Using $H_2O$ or $O_3$ as Oxidant", Thin Solid Films vol. 478 (2005), pp. 103-108.
J.W. Elam et al., "Growth of ZnO/$Al_2O_3$ Alloy Films Using Atomic Layer Deposition Techniques", Reported in Chem. Mater. vol. 15, pp. 1020-1028 (2003).
Office Action for corresponding Chinese patent application No. 200710196320.9 dated May 12, 2010 with English translation.

* cited by examiner

Primary Examiner—Thinh T Nguyen
(74) Attorney, Agent, or Firm—Harness, Dickey & Pierce, P.L.C.

(57) ABSTRACT

Provided are a charge trap semiconductor memory device including a charge trap layer on a semiconductor substrate, and a method of manufacturing the charge trap semiconductor memory device. The method includes: (a) coating a first precursor material on a surface of a semiconductor substrate to be deposited and oxidizing the first precursor material to form a first layer formed of an insulating material; (b) coating a second precursor material formed of metallicity on the first layer; (c) supplying the first precursor material on the surface coated with the second precursor material to substitute the second precursor material with the first precursor material; and (d) oxidizing the first and second precursor materials obtained in (c) to form a second layer formed of an insulating material and a metal impurity, and (a) through (d) are performed at least one time to form a charge trap layer having a structure in which the metal impurity is isolated in the insulating material.

11 Claims, 7 Drawing Sheets

CHARGE TRAP LAYER FOR A CHARGE TRAP SEMICONDUCTOR MEMORY DEVICE AND METHOD OF MANUFACTURING THE SAME

This U.S. non-provisional patent application claims the benefit of priority under 35 U.S.C. §119 to Korean Patent Application No. 10-2006-0120142, filed on Nov. 30, 2006, in the Korean Intellectual Property Office (KIPO), the disclosure of which is incorporated herein in its entirety by reference.

BACKGROUND

A non-volatile memory device is a storage device that may maintain previously stored data even when the power is turned off.

The structure of memory cells constituting the non-volatile memory device may vary according to the field where the non-volatile memory device is used.

In a NAND type flash semiconductor memory device, which is an example of a higher capacity non-volatile semiconductor memory device, a gate of a transistor thereof may include a floating gate in which charges (e.g., data), are stored, and a control gate controlling the floating gate may be sequentially stacked.

To increase memory capacity, the size of memory cells may be rapidly reduced in the flash semiconductor memory device. Also, it may be desirable to reduce the height of the floating gate in a vertical direction according to the reduction in the size of the memory cells.

In addition to reducing the height of the memory cells in a vertical direction, to maintain memory characteristics of a memory cell (for example, the retention characteristic for safely maintaining stored data in case of a leakage current for a long period of time), a semiconductor memory device having a silicon-oxide-nitride-oxide-semiconductor (SONOS) structure or a metal-oxide-insulator-oxide-semiconductor (MOIOS) structure (such as a metal-oxide-nitride-oxide-semiconductor (MONOS)), which are formed of a silicon nitride layer ($Si_3N_4$) instead of a floating gate as a means for storing charges, has been suggested and actively researched. The SONOS memory device may use silicon as a material for the control gate, and the MONOS memory device may use metal for a material for the control gate.

The SONOS memory device is disclosed in more detail in "An Embedded 90 nm SONOS Nonvolatile Memory Utilizing Hot Electron Programming and Uniform Tunnel Erase" by C. T. Swift et al., on p. 927-930 in Technical Digest of International Electron Device Meeting (IEDM published in December, 2002).

In general, the SONOS memory device may have a first silicon oxide layer ($SiO_2$) formed as a tunnel insulating layer such that both ends of the silicon oxide layer may contact source and drain regions on a semiconductor substrate between the source and drain regions (e.g., on a channel region). The first silicon oxide layer may be for tunneling of charges. A silicon nitride layer ($Si_3N_4$) may be formed on the first silicon oxide layer as a charge trap layer. The silicon nitride layer may be a material layer in which data is substantially stored and charges which have passed through the first silicon oxide layer are trapped in the silicon nitride layer, for example. A second silicon oxide layer may be formed on the silicon nitride layer to block charges that pass through the silicon nitride layer and move upward. A gate electrode may be formed on the second silicon oxide layer.

However, the SONOS memory device having the above structure may have problems in that the permittivity of the silicon nitride layer and the silicon oxide layer is lower and the density of the trap site in the silicon nitride layer may not be sufficient. Thus, the operation voltage may be higher, and the data recording speed (programming speed) and the charge retention time in vertical and horizontal directions may not be as desired.

It has been reported that the programming speed and the retention characteristic may be improved when using an aluminum oxide layer ($Al_2O_3$) instead of a silicon oxide layer as the blocking insulating layer. However, the degree of improvement may not yet be sufficient.

Although the blocking insulating layer formed of an aluminum oxide may suppress charges that go out from the silicon nitride layer, the trap site density in the silicon nitride layer itself may still not be sufficient. Thus, the retention characteristic may not be improved by using an aluminum oxide layer.

Further, regarding the SONOS type structure, U.S. Patent Publication No. 2004/0264236 A1 discloses a memory device which may be realized by using an insulating thin film of $HfO_2$ including a lanthanide metal impurity instead of a silicon nitride layer as a charge trap material.

Also, U.S. Pat. No. 6,998,317 discloses a memory device including a charge trap layer that may be formed by stacking an $HfO_2$ insulating thin film and treating the same with plasma.

A memory device including a charge trap layer which may be formed by forming a nanolaminate thin film of $HfO_2$ and $Al_2O_3$ thin films using an atom layer deposition (ALD) method as a charge trap material is disclosed in "High density and program-erasable metal-insulator-silicon capacitor with a dielectric structure of $SiO_2/HfO_2$—$Al_2O_3$ nanolaminate/$Al_2O_3$" by Shi-Jin Ding et al., pp. 0429051-0429053 in Applied Physics Letter vol. 88, published in 2006.

When a metal impurity, such as lanthanide metal as disclosed in U.S. Patent Publication No. 2004/0264236 A1, may be formed in an insulating thin film used as a layer to trap and maintain charges (e.g., used as a charge trap layer, or a defect in $HfO_2$ thin film which may be induced by plasma as disclosed in U.S. Pat. No. 6,998,317), is used in a memory device, the defect or the metal impurity, which is a charge trap site, may be randomly arranged in the charge trap layer. Accordingly, the horizontal and vertical distance between trap sites may not be controlled as desired. Thus, it may be difficult to control movement of charges between the trap sites. Due to this characteristic, charge leakage in the vertical and horizontal directions may not be effectively prevented in a non-volatile memory semiconductor device which should retain the trapped charges for long time.

When a nanolaminate thin film is used, the defect of the $HfO_2$ layer in the nanolaminate thin films stacked in the $HfO_2$ and $Al_2O_3$ thin films or the defect of the interface defect between the $HfO_2$ and $Al_2O_3$ thin films may act as a charge trap site.

When the SONOS semiconductor memory device operating uses the charge trap in the thin films, the density of trap site may determine the programming and retention characteristics. To increase the programming speed, the density of trap site may need to be effectively increased. Because the nanolaminate thin films may use the defect in the $HfO_2$ thin film or the defect of the interface, it may be difficult to increase the density of trap site.

SUMMARY

Example embodiments may provide a charge trap semiconductor memory device that may include a thin layer of a high-k dielectric insulator containing a metal impurity, the position of which is controlled, (e.g., site-modulated, metal-doped insulator SMI) as a charge trap layer, and a method of manufacturing the charge trap semiconductor memory device.

According to example embodiments, there may be provided a method of manufacturing a charge trap layer on a semiconductor substrate, the method including (a) coating a first precursor material on a surface of a semiconductor substrate to be deposited and oxidizing the first precursor material to form a first layer formed of an insulating material; (b) coating a second precursor material formed of metallicity on the first layer; (c) supplying the first precursor material on the surface coated with the second precursor material to substitute the second precursor material with the first precursor material; and (d) oxidizing the first and second precursor materials obtained in (c) to form a second layer formed of an insulating material and a metal impurity. The method may be performed at least one time to form a charge trap layer having a structure in which the metal impurity is isolated in the insulating material.

The operation (a) may be performed at least one time. In (a), the coating of the first precursor material and the supplying of an oxidizer for oxidizing the first precursor material may be performed sequentially.

In (a) and (b), the first and second precursor materials may be coated by spilling the first and second precursor materials to saturate a surface with the molecules of the first and second precursor materials.

The example method may also include purging to remove a remaining gas and reaction residual product after coating the first or second precursor material.

The first precursor material may be a metal precursor, such as trimethylauminum (TMA) and the insulating material may be $Al_2O_3$, for example.

The second precursor material may be diethylzinc, and the charge trap layer may be formed of a Zn-doped $Al_2O_3$. $H_2O$ may be used as an oxidizer for oxidizing the first and second precursor materials.

According to example embodiments, there may be a charge trap semiconductor memory device including a tunnel insulating layer formed on a semiconductor substrate, and a charge trap layer formed on the tunnel insulating layer. The charge trap layer may have a first layer formed of an insulating layer, and a second layer formed of the same insulating layer as the first layer and a metal impurity that may be isolated in the insulating material on a molecular level. The charge trap semiconductor memory device may include at least one pair of the first and second layers.

The second layer may be formed of one layer and the first layer is formed of at least one layer.

The first and second layers may be formed in atom layer unit.

The charge trap layer may be formed of Zn-doped $Al_2O_3$.

BRIEF DESCRIPTION OF THE DRAWINGS

The above and other features and advantages of the example embodiments will become more apparent by describing in detail exemplary embodiments thereof with reference to the attached drawings in which.

DETAILED DESCRIPTION OF THE INVENTION

Example embodiments will now be described more fully with reference to the accompanying drawings, in which exemplary embodiments of the invention are shown.

Detailed illustrative embodiments of example embodiments are disclosed herein. However, specific structural and functional details disclosed herein are merely representative for purposes of describing example embodiments. The example embodiments may, however, be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
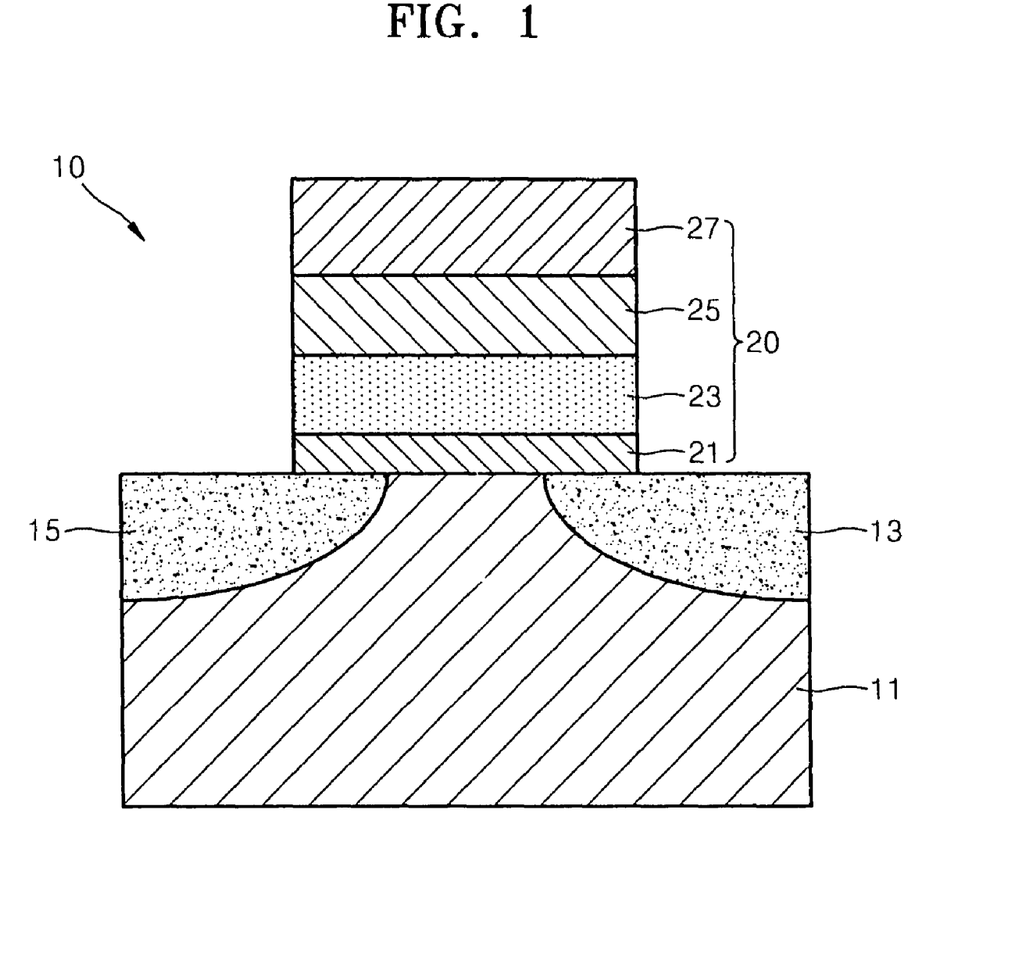
FIG. 1 is a schematic view of a charge trap semiconductor memory device according to an example embodiment.

FIG. 1 is a schematic view of a charge trap semiconductor memory device 10 according to an embodiment of the present invention. The thicknesses of layers and regions in FIG. 1 are exaggerated for clarity.

Referring to FIG. 1, the charge trap semiconductor memory device 10 may include a gate stack 20 formed on a semiconductor substrate 11.

First and second impurity regions 13 and 15 doped with a predetermined conductive impurity may be formed on the semiconductor substrate 11. One of the first and second impurity regions 13 and 15 may be a drain region (D) and the other one thereof may be a source region (S).

The gate stack 20 may be formed to be in contact with the first and second impurity regions 13 and 15. The gate stack 20 may include a charge trap layer 23. A tunnel insulating layer 21 may be formed between the semiconductor substrate 11 and the charge trap layer 23. The tunnel insulating layer 21 may be formed on the semiconductor substrate 11 to be in contact with the first and second impurity regions 13 and 15. A blocking insulating layer 25 may be formed on the charge trap layer 23, and a gate electrode 27 may be formed on the blocking insulating layer 25. The tunnel insulating layer 21, the charge trap layer 23, the blocking insulating layer 25, and the gate electrode 27 may be sequentially stacked on the semiconductor substrate 11.

The thickness of the tunnel insulating layer 21 may be 1.5 to 5 nm. The tunnel insulating layer 21 may be formed of an insulating thin film, such as a silicon oxide layer ($SiO_2$), a silicon nitride layer ($Si_3N_4$), a silicon oxide-nitride-layer ($SiO_xN_y$) or an aluminum oxide layer ($Al_2O_3$) using a thermal oxidization method, a chemical vapor deposition (CVD) method, or an atom layer deposition (ALD) method, for example.

The charge trap layer 23 may be formed of a thin layer of a high-k dielectric insulator containing a metal impurity of which the position is controlled (e.g., a site-modulated metal-doped insulator (SMI)). The charge trap layer 23 may be formed such that the metal impurity may be isolated at a molecular level in the insulating thin film. For example, the charge trap layer 23 may be formed such that ZnO may be isolated at a molecular level in an $Al_2O_3$ layer. The charge trap layer 23 may be formed to a thickness of 2 to 15 nm using an ALD method, for example.

The ALD method is a modified method of a chemical vapor deposition (CVD) method in order to induce self-limiting growth of a thin film. When a metal oxide layer is deposited using the CVD method, a metal precursor and an oxidization gas to be deposited as a thin layer may be supplied to a deposition apparatus at the same time forming a thin film by pyrolysis and oxidization. In the ALD method, a metal precursor and an oxygen gas may be sequentially supplied. Between supplying the metal precursor and the oxygen, purging may be performed to remove a remaining gas and a reaction residual product from a reactor using an inactive gas such as Ar. The processes may be performed at 200 to 300° C. at which the precursors may not be pyrolysed. Accordingly, the thin film may be formed by controlling in an atom layer unit by only the adhesion reaction on the surface.

An example method of manufacturing the charge trap layer 23 by applying the ALD method will be described in more detail later.

The blocking insulating layer 25 may be formed of a high-k dielectric thin film having a high permittivity and band gap. For example, the blocking insulating layer 25 may be formed of $Si_3N_4$, $HfO_2$, $Ta_2O_5$, $ZrO_2$, or $Al_2O_3$ layer.

The gate electrode 27 may be formed of a metal layer having an increased work function. For example, the gate electrode 27 may be formed of gold (Au) or an aluminum layer. Alternatively, the gate electrode 27 may be formed of a metal such as Ru or TaN, or a silicide material such as NiSi that is used usually as a gate electrode of a semiconductor memory device, for example.

Hereinafter, a n example method of manufacturing a charge trap layer according to an embodiment will be described with reference to FIGS. 2A through 2G. The charge trap layer 23 may be formed of an insulating material containing a metal impurity, such as $Al_2O_3$ layer containing Zn.

Figure 2A:
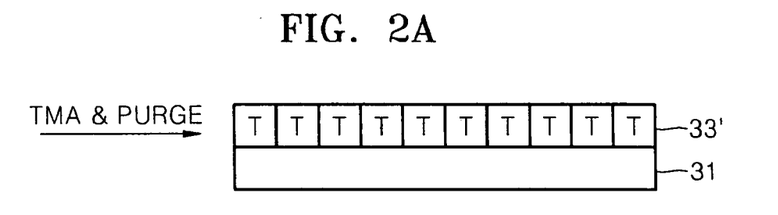
FIGS. 2A through 2G illustrate a method of manufacturing a charge trap layer according to an example embodiment.

Referring to FIG. 2A, a first precursor may be applied to a surface of a substrate 31 to be deposited, for example, on a surface of a semiconductor substrate 11 on which a tunnel insulating layer 21 may be formed. The first precursor may be used to saturate the surface of the substrate 31 with a molecule 33' of the first precursor material. The first precursor material may be provided as plasma, for example. When the charge trap layer 23 is formed of a metal oxide, a metal precursor may be used as the first precursor material. For example, the first precursor material may be an Al precursor (e.g., trimethylaluminum (TMA)). Hereinafter, the first precursor material will be represented as TMA. In FIG. 2A, T denotes a monomer of a TMA molecule.

Figure 2B:
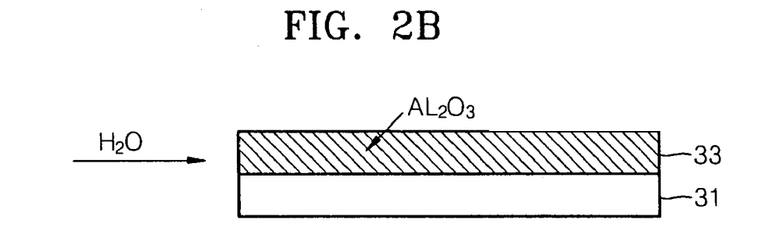

As illustrated in FIG. 2B, the TMA molecule saturated on the surface of the substrate may be oxidized by supplying oxidization gas. For example, the saturated TMA molecule may be oxidized using $H_2O$, which is an oxidizer, to form a first layer 33 formed of an $Al_2O_3$ thin film.

Figure 2C:
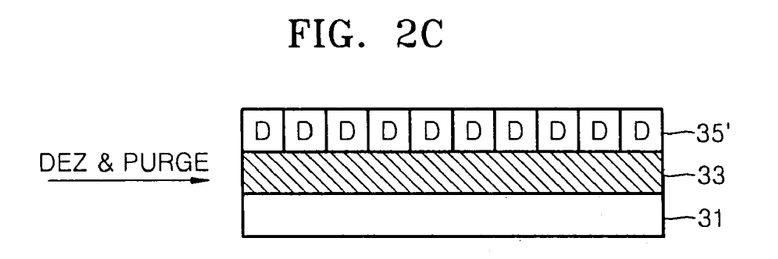

After forming the first layer 33 of the $Al_2O_3$ thin film, a second precursor material of metallicity may be applied to the surface of the first layer 33 to saturate the surfaces of the first layer 33 with a molecule 35' of the second precursor material, as illustrated in FIG. 2C. The second precursor material may be provided as plasma, for example. The second precursor material may be a Zn precursor, (e.g., diethylzinc (DEZ)). Hereinafter, the second precursor material will be represented as DEZ. In FIG. 2C, D denotes a monomer of a DEZ molecule.

Figure 2D:
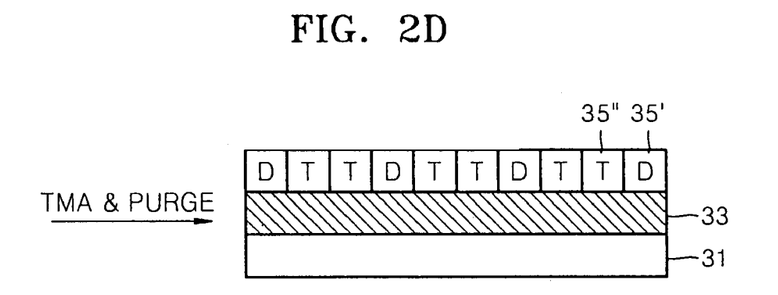

After saturating the surface of the first layer 33 with a DEZ molecule 35', a portion of the DEZ molecule 35' may be substituted with a TMA molecule 35" by applying a TMA molecule, as illustrated in FIG. 2D.

Figure 2E:
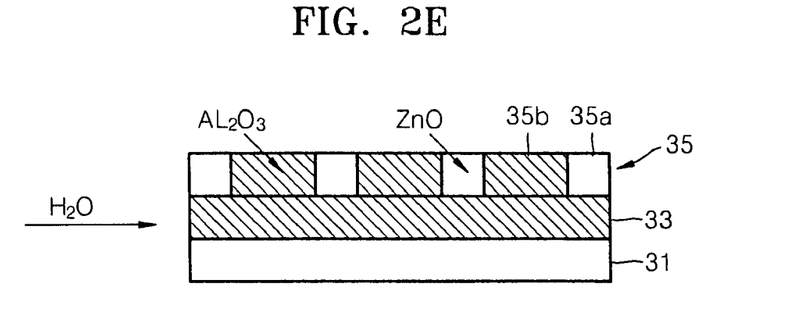

As illustrated in FIG. 2E, the portion by saturated DEZ and TMA molecules 35' and 35" are oxidized by applying $H_2O$ thereon. Then, a second layer 35 which is a thin film, in which a metal impurity 35a (ZnO) may be isolated inside an insulating material 35b ($Al_2O_3$) at a molecular level, is obtained.

To obtain an insulating material formed of a metal oxide and a third metal element that may be substituted in desired portions of a film formed of the insulating material with a desired density, a precursor suitable for metals and plasma suitable as an oxidizer may be alternately used to control the surface adhesion ratio for each metal atom.

Figure 2F:
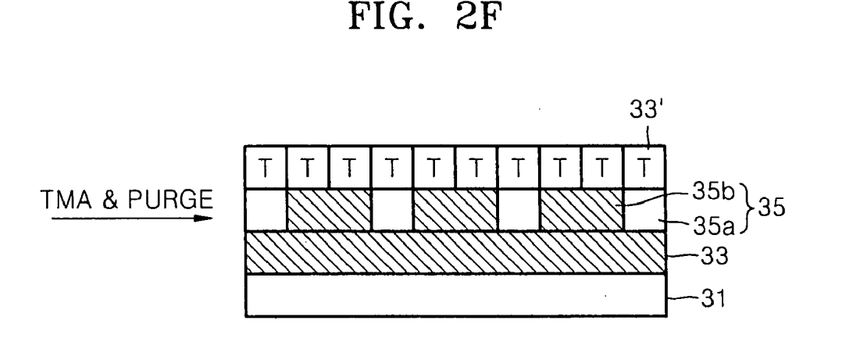

As illustrated in FIG. 2F, a TMA molecule 33' may be applied to saturate the surface of the second layer 35 and oxidized using $H_2O$ to form another first layer 33 formed of an $Al_2O_3$ thin film.

As illustrated in FIGS. 2A, 2C, 2D, and 2F, after coating the first precursor material or the second precursor material, purging may be performed to remove a remaining gas and a reaction residual product from a reactor. The purging gas may be an inactive gas such as Ar, for example.

Each of the processes may be performed at 200-300° C., at which temperature the precursor may not be pyrolysed. Accordingly, the thin film may be formed by controlling only the adhesion reaction on the surface in an atom layer unit.

Figure 2G:
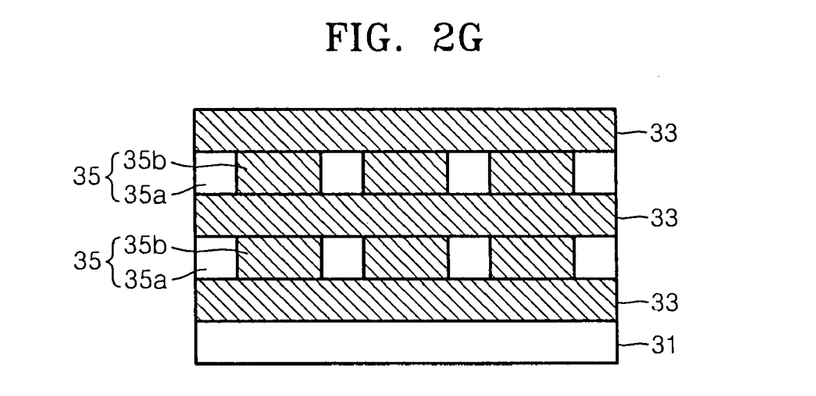

By performing the whole processes repeatedly, a charge trap layer 23, which may be formed such that the metal impurity may be isolated at a molecular level in the insulating material, may be formed as illustrated in FIG. 2G. Some of the processes, for example, forming the first layer 33 which may be formed only of an $Al_2O_3$ film, may be repeated several times, so that at least one first layer 33 may be disposed between the second layers 35.

FIGS. 2A through 2G illustrate example processes of forming the first and second layers 33 and 35, the processes being performed only once. A charge trap layer 23 may be formed by forming the first layer 33a plurality of times, and then forming the second layer 35.

When the total number of stacking layers counted by atom layer unit the charge trap layer 23 is predetermined, if the stacking number of the first layers 33 between the second layers 35 is larger, the total content of the metal impurity in the charge trap layer 23 may be decreased. In contrast, when the stacking number of the first layers 33 formed between the second layers 35 is smaller, the total content of the metal impurity inside the charge trap layer 23 may be increased.

Because the first and second layers 33 and 35 may be formed by atom layer unit using the ALD method, the total content of the metal impurity inside the charge trap layer 23 may be controlled by controlling the stacking number of the first layers 33 formed between the second layers 35. That is, the doping density of the metal impurity, which functions as a trap site, may be controlled. Also, the position of the metal impurity (e.g., the position of the charge trap site), may be controlled by controlling the stacking number of the first layers 33 formed between the second layers 35.

Therefore, according to example embodiments, the amount of the molecule of the second precursor material (e.g., DEZ) that is substituted by the molecule of the first precursor material (e.g., TMA) may be controlled. Thus, the amount of the metal impurity (the doping density), may be controlled, and the position of the metal impurity may also be controlled. Accordingly, a charge trap layer 23 formed of a high-k dielectric insulator thin film (SMI) including a metal impurity whose position is controlled may be formed.

When a blocking insulating layer 25 and a gate electrode 27 are formed after forming the charge trap layer 23 on the semiconductor substrate 11 including the tunnel insulating layer 21, by the above described example processes, a gate stack 20 illustrated in FIG. 1 may be obtained.

According to example embodiments, an annealing treatment may be performed during the processes of forming the charge trap layer 23. In this case, a charge trap site in which residual electrons or holes can be trapped, for example, by Zn substituting Al atoms, may be generated more precisely.

Hereinafter, the charge trap layer 23 and characteristics thereof according to example embodiments will be described.

In example embodiments, TMA may be used as an Al precursor, DEZ may be used as a Zn precursor, water ($H_2O$) may be used as an oxidizer, and the deposition temperature may be 250° C. An ALD method using TMA and water, and the electric characteristic of a deposited $Al_2O_3$ thin film have been reported by M. D. Groner et al. in Thin solid Films, vol. 413, pp. 186-197 (2002), and an ALD ZnO thin film deposited using DEZ and water has been reported by Kim et al. in Thin Solid Films, vol. 478, pp. 103-108 (2005).

Before depositing a Zn-doped $Al_2O_3$ ($Al_2O_3$:Zn) thin film, $Al_2O_3$ and ZnO may be deposited at 250° C. using an ALD method, respectively, to check the growth speed of $Al_2O_3$ and ZnO thin films, respectively. The growth speed of $Al_2O_3$ and ZnO were ~1.2 Å/cycle and ~1.4 Å/cycle, respectively. The process conditions for each were as follows:

$Al_2O_3$: precursor: TMA, oxidizer: water,
  growth temperature: 250° C., purging gas: Ar (1600 sccm)
  TMA (0.5 sec)-Ar (5 sec)-water (2 sec)-Ar (5 sec)
ZnO: precursor: DEZ, oxidizer: water,
  growth temperature: 250° C., purging gas: Ar (1600 sccm)
  DEZ (2 sec)-Ar (5 sec)-water (2 sec)-Ar (5 sec)

In the charge trap semiconductor memory device according to example embodiments, when the charge trap layer 23 is deposited as a Zn-doped $Al_2O_3$ (:Zn) thin film, the precursor and the oxidizer may be used.

Figure 3:
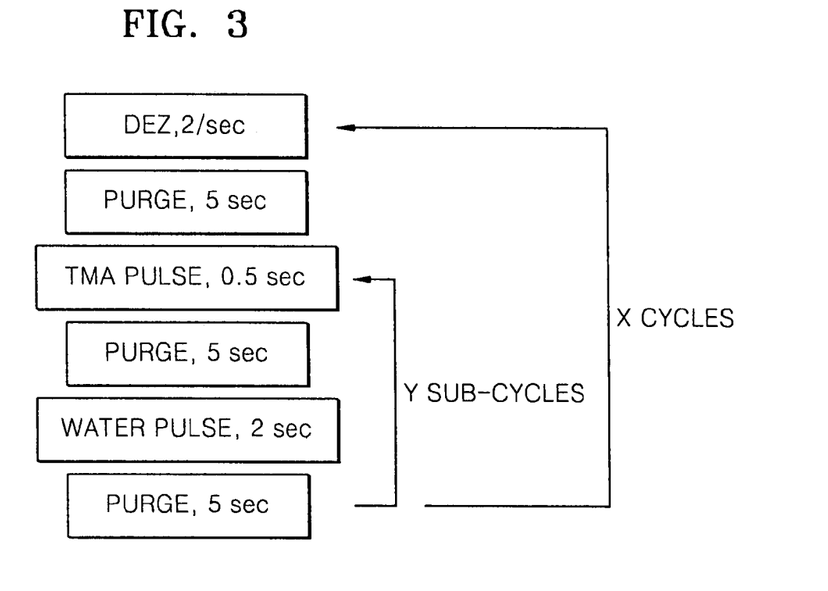
FIG. 3 is a flowchart illustrating of a method of forming a charge trap layer according to an example embodiment.

FIG. 3 is a flowchart of an example method of forming a charge trap layer 23 according to example embodiments. In FIG. 3, Y sub-cycles of deposition process where only DEZ is adhered, and then TMA is directly supplied without oxidization process, are repeated X cycles (where X is an integer greater than 1, and Y is an integer greater than 1). In other words, as a sub-cycle, forming of a first layer ($Al_2O_3$ thin film) between second layers may be performed one or more times, and the process of sequentially forming a first layer formed of at least one layer and a second layer formed of one layer may be performed one or more times.

Figure 4:
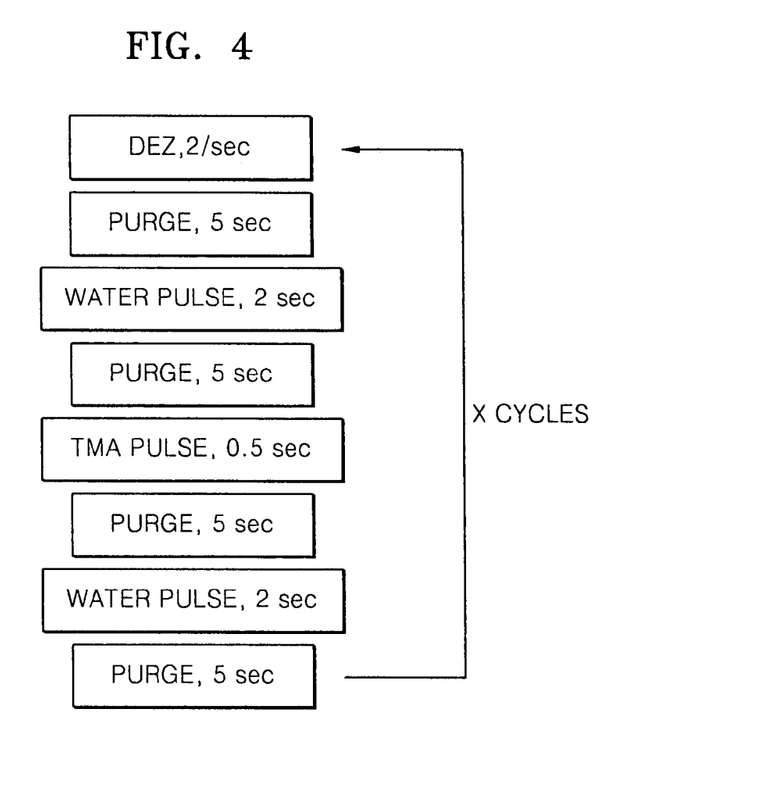
FIG. 4 is a flowchart illustrating a process of forming a ZnO layer and an $Al_2O_3$ layer in X cycles, as a comparison example.

FIG. 4 is a flowchart of an example process of repeatedly forming ZnO and $Al_2O_3$ layers in X cycles ("a comparison process flowchart") as a comparison example.

When the example process is performed, as shown in FIG. 3, and the growth speed of each of the ZnO and $Al_2O_3$ films is applied to the Zn-doped $Al_2O_3$ ($Al_2O_3$:Zn) thin film, the growth speed should be 2.6 Å/cycle. However, the deposition speed according to the comparison process flowchart was about 2.1 Å/cycle. This result may be because the deposition speed in the case where a thin film is formed of one layer is significantly different from the speed in the case where a thin film is formed of a plurality of layers. However, in example embodiments, this result may be because the grown one ZnO layer is etched by the precursor TMA of $Al_2O_3$ that is subsequently deposited.

Elam et al. reported in Chem. Mater. vol. 15, pp. 1020 (2003) that the composition and thickness of a thin film is deviated from the rule of mixture as the ZnO/$Al_2O_3$ nanolaminate thin film is deposited because Zn is etched by TMA.

Analyzing the thin film deposited by the comparison process flowchart illustrated in FIG. 4 by inductively coupled plasma-atomic emission spectroscopy (ICP-AES), the content of Zn in the thin film (Zn/(Zn+Al)*100) was 11.2%, which is relatively high. Because it may be preferable from the perspective of retention characteristics that stored charges are suppressed the movement in a horizontal or vertical direction in the charge trap layer, it may be preferable to further reduce the content of Zn.

According to the example process flowchart of FIG. 3, an oxidization process may be excluded to maximize the etching effect of Zn. Thus, the content of Zn in the deposited thin film may be reduced significantly.

When the thin film is deposited in the sub-cycle Y=1 of the example process shown in FIG. 3, the deposition speed of the thin film was 1.17 Å/cycle. This approximates the growth speed of $Al_2O_3$, indicating that the inflow of Zn may be significantly reduced. Also, the content of Zn of the thin film was reduced to 5.1% as expected.

Accordingly, as in the example embodiments, when Y sub-cycles of the deposition process where only DEZ is adhered and TMA is directly supplied without an oxidization process are repeated X cycles, the content of Zn in the thin film may be reduced significantly, and the position between trap site in a stack direction (vertical direction) may be controlled. In other words, the trap position and density in the charge trap layer 23 may be efficiently controlled. Accordingly, the movement of stored charges in the charge trap layer in a horizontal or vertical direction maybe suppressed giving a non-volatile semiconductor memory device improved retention characteristics.

Figure 5:
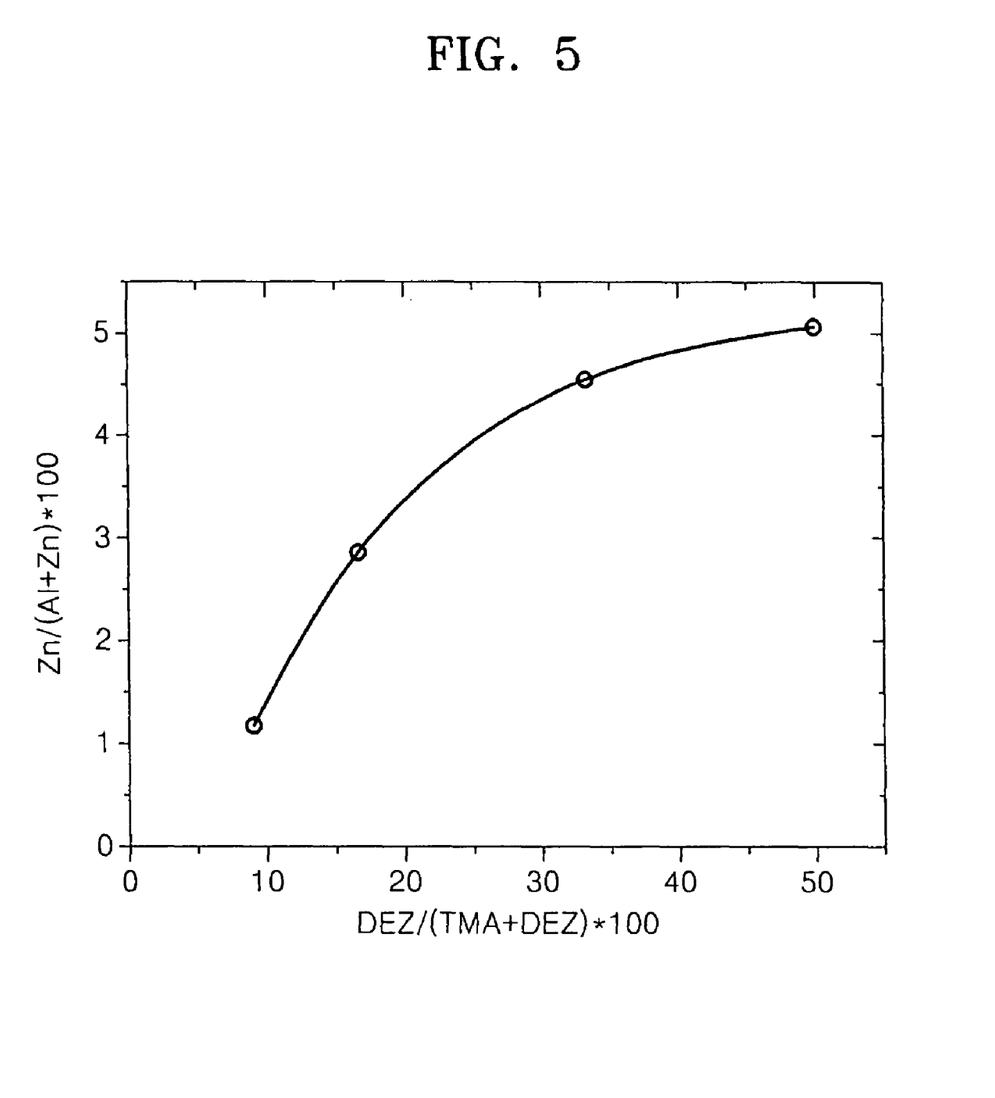
FIG. 5 shows a change in the composition of Zn of a ZnO thin film that may be deposited using an atom layer deposition (ALD) method by the example method of a flowchart according to an example embodiment according to the reduction in the ratio of supplying DEZ.

FIG. 5 shows an example of the change in the composition of Zn of a ZnO thin film that is deposited using an atom layer deposition (ALD) by an example method that reduces the ratio of DEZ in the supplying process. For example, the Y sub-cycles in the process were performed for Y=2, 5, and 10 to investigate the inflow amount of Zn and the results are shown in FIG. 5 with when Y=1.

As may be seen in FIG. 5, the smaller the number of Y sub-cycles (TMA process times), the greater the inflow ratio of Zn into the thin film. However, the inflow ratio of Zn may be saturated gradually. In other words, as the number of Y sub-cycles is increased, the inflow ratio of Zn into the thin film may be reduced.

Thus, the inflow ratio of Zn into the thin film (the density of charge trap number) may be controlled by controlling the number of Y sub-cycles. Also, because the layers are stacked in an atom layer unit, the inflow position of Zn (the position of charge trap site), may be controlled by controlling the number of Y sub-cycles.

Accordingly, the horizontal and vertical distances between charge trap sites may be controlled arbitrarily. That is, the charge trap position and the density may be effectively controlled in the charge trap layer.

Figure 6:
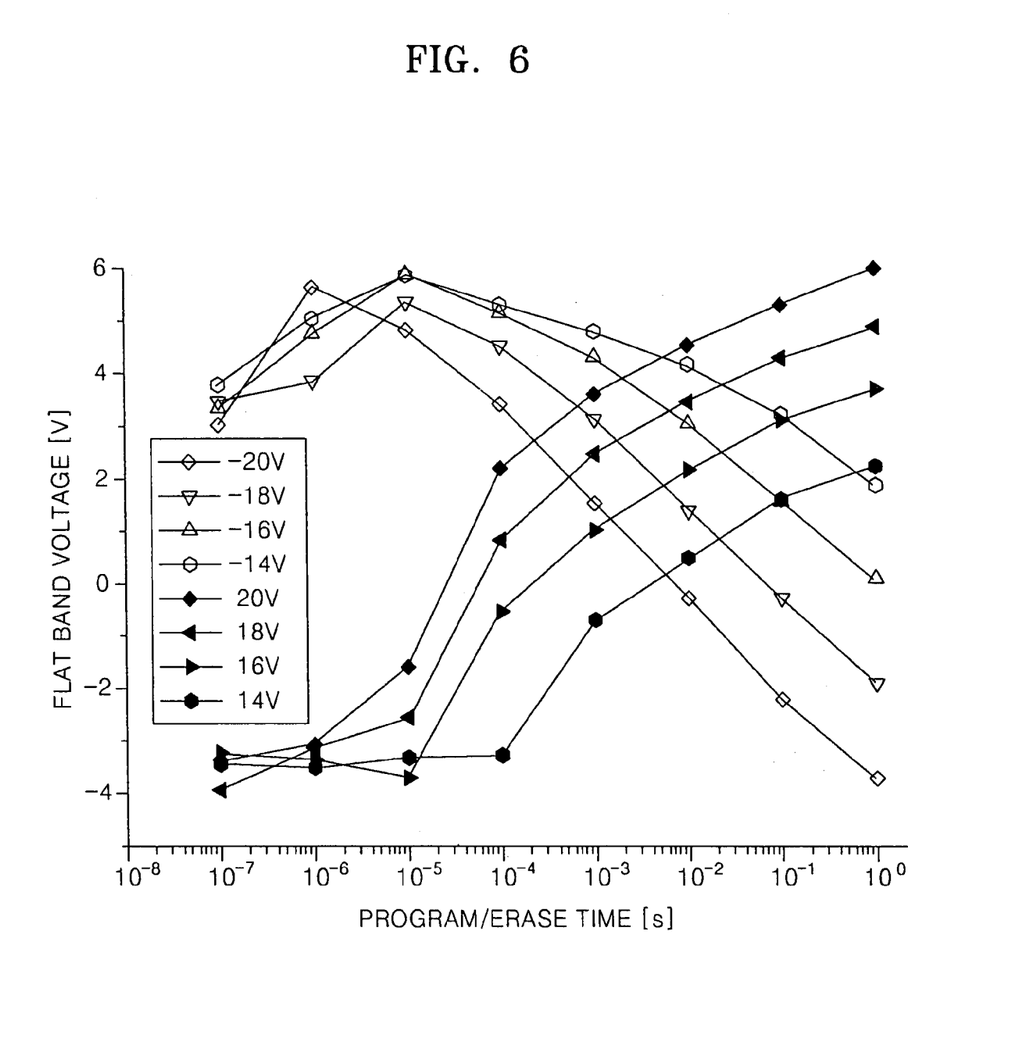
FIG. 6 illustrate example programming/erasing characteristics of a charge trap semiconductor memory device manufactured according to the example manufacturing method of an example embodiment.

FIG. 6 illustrates the programming/erasing characteristics of a charge trap semiconductor memory device manufactured according to example embodiments.

The programming/erasing characteristics shown in FIG. 6 were obtained for a sample having a silicon oxide layer formed to a thickness of 5 nm using a thermal oxidization method as the tunnel insulating layer 21, a charge trap layer 23 formed on the tunnel insulating layer 21 to a thickness of 7 nm by applying the process of the present invention of FIG. 3 at Y=1, and a $HfO_2$ layer formed as a blocking insulating layer 25 using an ALD method to a thickness of 20 nm.

Figure 7:
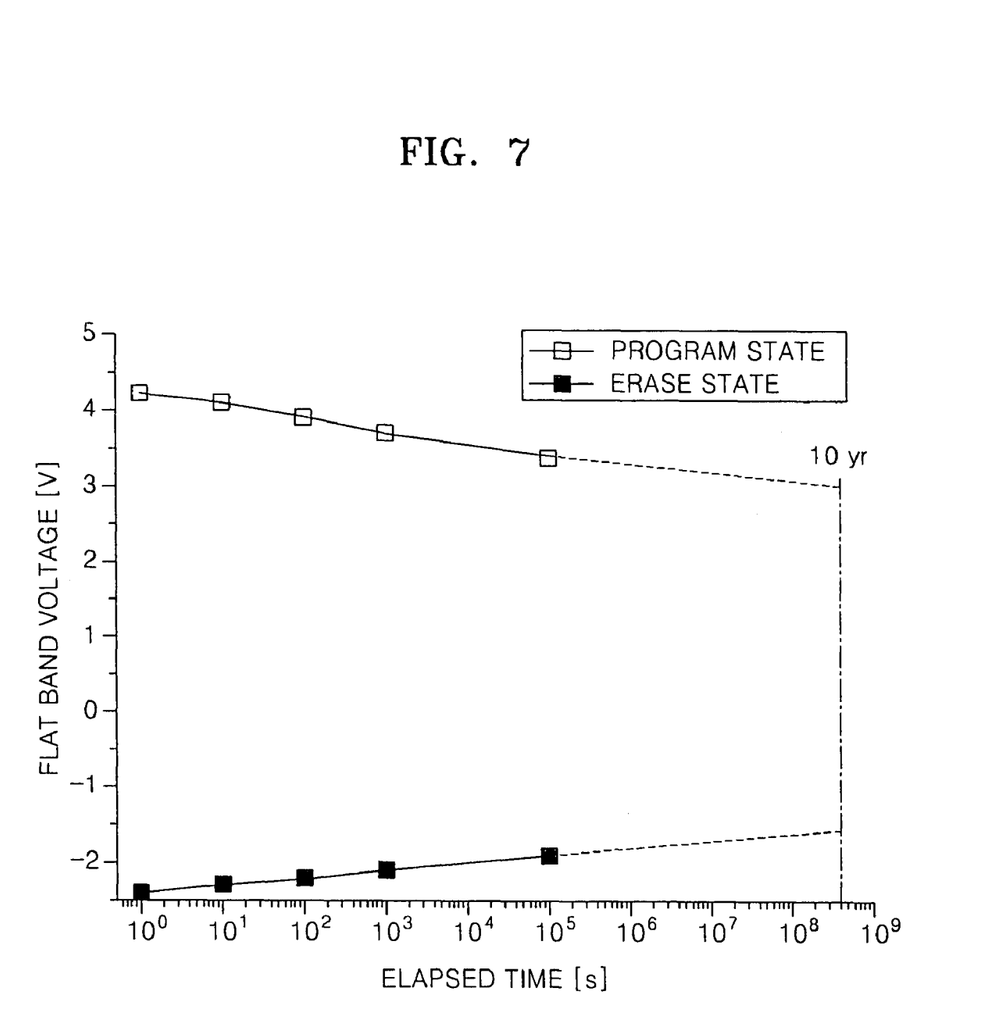
FIG. 7 illustrates an example retention characteristic of a sample showing the example programming/erasing characteristics of FIG. 6.

To examine the programming characteristic, the variation of a flat band voltage was recorded by varying the programming time from $10^{-7}$ s to 1 s at a voltage applied to the gate electrode in the range of 14 V to 20 V. To examine the erasing characteristic, the variation of a flat band voltage was recorded by varying the erasing time from $10^{-7}$ s to 1 s at a voltage applied to the gate electrode in the range of −20 V to −14 V. FIG. 7 illustrates a retention characteristic of the sample indicating the programming/erasing characteristics of FIG. 6.

The result shown in FIG. 7 shows the variation of the flat band voltage according to time when the charge trap semiconductor memory device (the sample) is programmed at a voltage of 20 V applied to the gate electrode 27 and a programming time of 0.1 s, and erased at a voltage of −20 V and at an erasing time of 1 ms in room temperature. FIG. 7 shows that a sufficient memory window can be secured even after 10 years.

As described above, according to example embodiments, the charge trap layer may be formed by SMI film containing a metal impurity whose position may be controlled. Thus the trap position and the density in the charge trap layer may be effectively controlled. Accordingly, a non-volatile semiconductor memory device having improved retention characteristics may be realized.

While example embodiments have been particularly shown and described with reference to the drawings, it will be understood by those of ordinary skill in the art that various changes in form and details may be made therein without departing from the spirit and scope of the example embodiments as defined by the following claims.

What is claimed is:

1. A method of manufacturing a charge trap layer, comprising:
    coating a first precursor material on a surface of a tunnel insulating layer and oxidizing the first precursor material to form a first layer formed of an insulating material;
    coating a second precursor material on the first layer;
    supplying the first precursor material on the surface coated with the second precursor material; and
    oxidizing the first and second precursor materials to form a second layer including the insulating material and a metal impurity, wherein
    the metal impurity is isolated in the insulating material forming a charge trap layer.

2. The method of claim 1, wherein coating and oxidizing the first precursor material to form the first layer is performed at least one time.

3. The method of claim 2, wherein coating the first precursor material and oxidizing the first precursor material are performed sequentially.

4. The method of claim 1, wherein the first precursor material and the second precursor material are coated by applying the first material and the second precursor material to saturate a surface of the tunnel insulating layer and the first layer, respectively, with the molecules of the first precursor material and second the second precursor material.

5. The method of claim 1, further comprising purging a remaining gas and reaction residual product after coating at least one of the first layer and the second precursor material.

6. The method of claim 1, wherein the first precursor material is a metal precursor.

7. The method of claim 6, wherein the first precursor material is trimethylauminum (TMA) and the insulating material is $Al_2O_3$.

8. The method of claim 7, wherein the second precursor material is diethylzinc, and the charge trap layer includes a Zn-doped $Al_2O_3$.

9. The method of claim 8, wherein $H_2O$ is used as an oxidizer for oxidizing the first precursor material and the second precursor material.

10. The method of claim 6, wherein $H_2O$ is used as an oxidizer for oxidizing the first precursor material and the second precursor material.

11. The method of claim 6, further comprising purging a remaining gas and reaction residual product after coating at least one of the first layer and the second precursor material.

* * * * *